United States Patent [19]
Cahen

[11] 4,059,774
[45] Nov. 22, 1977

[54] SWITCHING INVERTER WITH THERMOCONDUCTIVE MATERIALS

[75] Inventor: Olivier Cahen, Paris, France

[73] Assignee: Thomson-CSF, Paris, France

[21] Appl. No.: 685,375

[22] Filed: May 11, 1976

[30] Foreign Application Priority Data

May 13, 1975 France .................................. 75.14878

[51] Int. Cl.² ...................... H03K 3/26; H03K 17/60; H03K 19/08; H03K 23/08

[52] U.S. Cl. .................... 307/299 R; 357/4; 357/17; 357/30; 179/110 R; 307/303; 338/7; 338/25; 338/22 R; 179/190

[58] Field of Search ............... 357/4, 17, 30; 307/299, 307/303; 338/7, 8, 9, 20, 21, 22, 25, 204, 205; 179/110 F, 100.1 B, 1 SH, 190

[56] References Cited

U.S. PATENT DOCUMENTS

| | | | |
|---|---|---|---|
| 3,555,365 | 1/1971 | Forlani et al. ......................... | 357/30 |
| 3,614,480 | 10/1971 | Berglund ............................... | 357/51 |
| 3,753,231 | 8/1973 | Hilsum .................................. | 357/17 |
| 3,790,867 | 2/1974 | Hayakawa ............................. | 357/17 |
| 3,806,759 | 4/1974 | Kabaservice .......................... | 357/17 |
| 3,827,033 | 7/1974 | Quilliam ................................ | 357/14 |
| 3,886,578 | 5/1975 | Eastwood et al. ..................... | 357/4 |

Primary Examiner—Andrew J. James
Attorney, Agent, or Firm—Oblon, Fisher, Spivak, McClelland & Maier

[57] ABSTRACT

A switching point, for telephone switching, and a matrix are provided. They use thermoconductor materials i.e. materials capable of a sudden change in conductivity at a certain temperature, as V $O_2$. The basic switching point comprises a resistive layer with a significant Joule effect, an insulating layer and a layer of V $O_2$, deposited one on top of the other on the same substrate, using thin layer technology. Two elements connected in series enable a logic inverter to be formed. Three thermoconductive elements enable a telephone wire switching point to be formed between two conductors with a middle point connected to earth.

6 Claims, 12 Drawing Figures

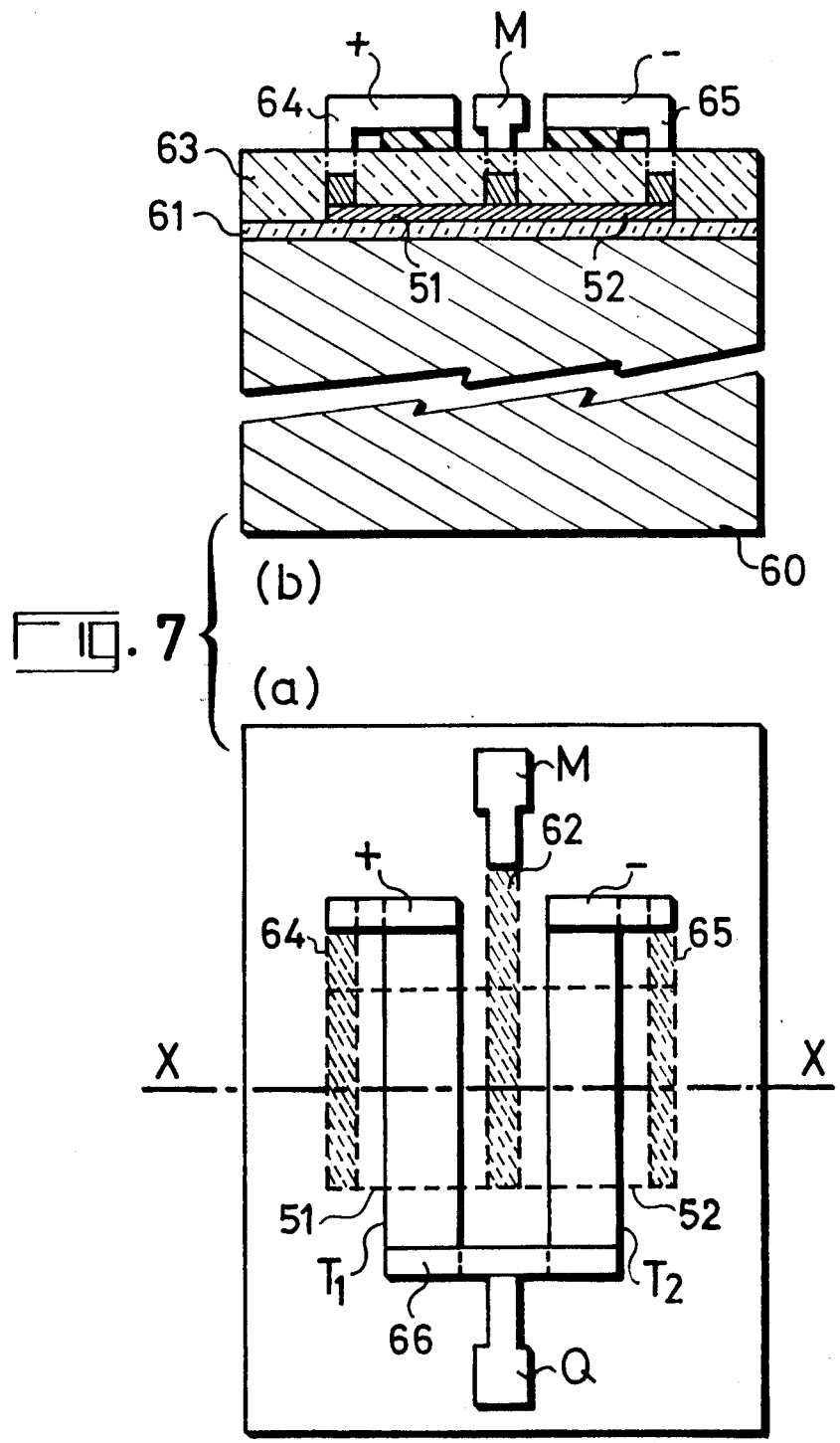

SWITCHING INVERTER WITH THERMOCONDUCTIVE MATERIALS

BACKGROUND OF THE INVENTION

This invention relates to the production, by thin-layer integrated circuit techniques, of switching circuits which are capable in particular of transmitting or interrupting telephone calls.

At present there are two telephone switching techniques, namely conventional switching and time-division switching.

Time-division switching, in which a position in a "frame" is attributed to each conversation, involves the use of a computer which memorizes the signals representing each conversation and restores them to the appropriate wire in the appropriate order. The invention is not concerned with this technique.

Conventional switching, with which the invention is concerned, comprises physically making or breaking circuits by means of switches, preferably of the automatically controlled type. The four principal techniques currently used for conventional switching are as follows:

switching with electromechanical relays (for example with a coil and armature);

switching with sealed contact relays (so-called reed relays);

switching with a matrix of electromechanical relays (crossbar type);

switching with semiconductor connection circuits.

Electromechanical relays are expensive and are being used to a diminishing extent.

The crossbar contact matrix is universally used. It is a mechanical assembly which is complex, fragile, heavy, expensive both in regard to purchase price and in regard to energy consumption and, in addition, lacks compactness (100 contacts per cubic decimeter). The reed relay is being used to an ever increasing extent, but requires a lot of special wirings and, in addition, a separate component for each contact.

Semiconductors, have certain disadvantages. Transistors have a waste voltage; thyristors have a high energy consumption and it is still not known to produce them in the monolithic integrated circuit technology.

The present invention does not have any of the disadvantages of the above-mentioned solutions.

SUMMARY OF THE INVENTION

The invention is based on the properties of materials referred to hereinafter as thermoconductors which, like vanadium oxide $VO_2$, show a sudden change in conductivity with a change in order of magnitude when a certain temperature, which the switching equipment is capable of withstanding, is exceeded. This is the case with $VO_2$, for which this temperature is 68° C.

According to the invention there is provided an integrated switching circuit of the type comprising thin layers deposited on a substrate, comprising at least one switching element including three layers, namely an electrically resistant layer with ends provided with ohmic contacts, an electrically insulating and thermally conductive layer and a layer of "thermoconductive" material whose electrical resistance varies rapidly as a function of temperature in the vicinity of a transition temperature between an insulating state and a conductive state, said layer of "thermoconductive" material comprising end provided with ohmic contacts, said element being electrically insulated from the substrate if said substrate is conductive.

BRIEF DESCRIPTION OF THE DRAWINGS

The invention is described in more detail in the following with reference to the accompanying drawings, wherein:

FIG. 7 is a plan view (a) of and a section (b) through one embodiment of the circuit shown in FIG. 6.

DESCRIPTION OF THE PREFERRED EMBODIMENTS

The principal on which the invention is based is as follows:

A thermoconductor is kept in an atmosphere in which, as a result of the temperature (below 68° C in the case of $VO_2$), its conductivity is very low and its ohmic resistance very high, amounting to a few thousand ohms. This state is the blocked state of the switching circuit. In order to change to the conductive state, i.e. to carry out a switching operation, in other words to establish a connection between the ends (provided with ohmic contacts) of the thermoconductor, an electric voltage is applied between the ends of an ohmic resistor coupled thermally to the thermoconductor through a thin insulating layer. By the Joule effect, the resistor is rapidly heated and, by thermal conduction through the insulating layer, the thermoconductor is also rapidly heated. The connection is established as a result of the sudden change in conductivity in the thermoconductive material which changes from a high resistance to a very low resistance amounting for example to a small fraction of an ohm. This connection may be maintained by providing a "holding" current in the resistor.

Figure 1:
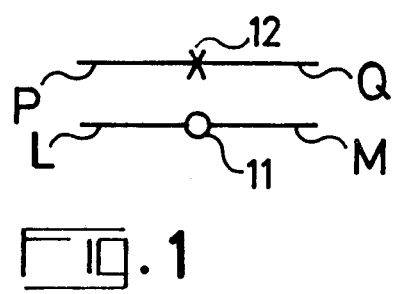
FIGS. 1 and 2 show, respectively, a symbol of the simplest circuit according to the invention and a technological section.

The most simple switching circuit comprises a resistant element coupled thermally to a thermoconductive element on one and the same substrate. In FIG. 1, this circuit is symbolically represented by:

a circle (reference 11) for the resistant element;

a cross (reference 12) for the thermoconductive element.

Figure 2:
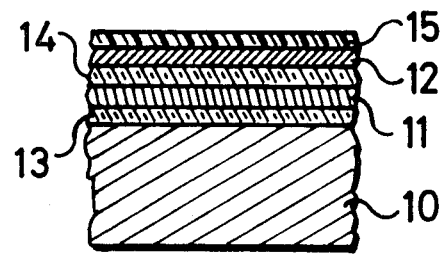

A technological embodiment of this thermal coupling is shown partly in section in FIG. 2. A substrate 10, for example of a conductive metal, successively supports an insulating layer 13, an electrically resistant layer 11, for example of tantalum, another insulating layer 14, a thermoconductive layer 12 of vanadium oxide and, finally, a last insulating layer 15. The input and output electrodes of the elements 11 and 12 have not been shown. The layers may be applied to the substrate by vapour deposition or by cathode sputtering. In particular, it is known that the vanadium dioxide can be deposited by cathode sputtering. All the layers may be photo-engraved in order to define the shape of the resistors and electrodes. Thermal coupling is very strong in the case of vertically adjacent layers, even through an insulating layer. On the other hand, the lateral thermal coupling is greatly reduced. The layer closest to the substrate may be either the resistant layer or the thermoconductive layer.

By virtue of the technology of thin layers, a thickness between 0.01 and 1 micron may be selected for each material, and the length-to-width ratio for the resistors and the thermoconductor can be freely chosen. The value of the resistors may thus be adapted to the feed voltage.

A few milliwatts are sufficient for heating a layer of thermoconductive material applied to a substrate, even if the substrate is a good conductor of heat, from ambient temperature to a transistion temperature such as that of $VO_2 : 68°$ C.

The quality of the contact in the conductive state is excellent. In particular, the resistance is low without any waste voltage.

The quality of the insulation as an insulator is also excellent. The resistance ratio is of the order of $10^4$ and protection against crosstalk with a single series contact is of the order of 60 dB. If the series contacts are doubled, protection is much greater, i.e. of the order of 100 dB.

Figure 3:
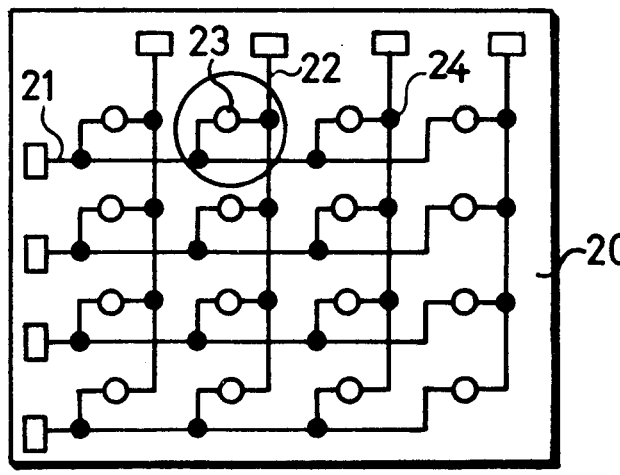
FIG. 3 illustrates one stage of a switching matrix according to the invention.

A matrix network of switching points may be formed on a single substrate by superposing a first stage comprising a matrix of resistors and a second stage comprising a matrix of the same configuration composed of thermocondutors. FIG. 3 shows a matrix of resistors 23 deposited onto a substrate 20. These resistors are positioned at the intersections of four lines 21 and four columns 22 fed respectively by control voltages of reverse polarity ($\pm$ 6 volts for example). These lines and columns are formed by metallization of bands cut by photo-engraving in a resin which can be removed by a chemical agent. In order to avoid electrical short-circuiting between lines and columns, a thin layer of insulating material is applied at the intersections 24, for example by masking and cathode sputtering of silica.

Figure 4:
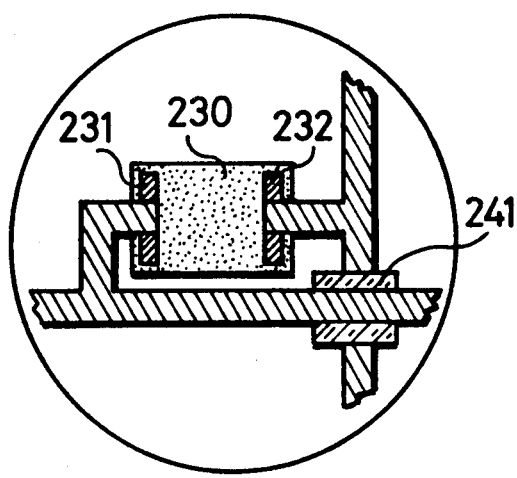
FIG. 4 shows a detail of FIG. 3 on a larger scale.

FIG. 4 shows the lower layers (metallization and resistance) of an intersection point on a greatly enlarged scale. An insulating zone 241 covers a fraction of column metallization. The resistor is formed by a localized layer of tantalum 230 covered at the two ends of the rectangular zone defining it by metal coatings 231 and 232 which are no more than extensions of the connecting metal coatings to the lines and to the columns.

The matrix of thermoconductors forming the second stage of the matrix network of switching points has not been shown. This stage would be formed by the same process at that which has just been described for the resistor matrix. The two-stage matrix thus formed is a proper switching matrix.

Referring to the switching circuit shown in FIG. 1, which may be referred to as an "elementary switch", the fan out of the equivalent logic circuit will now be examined. If a potential difference V is established between the ends L and M (FIG. 1) of the resistor 11, the two terminals P and Q of the thermoconductor are short-circuited. If, on the other hand, the two ends L and M are short-circuited, the terminals P and Q of the thermoconductor coupled to the resistor 11 are disconnected and the potential difference V may appear there. The ratio between the resistances of the thermoconductor 12 both in open and in closed operation is such that this potential difference V may appear there, irrespective of the number, up to several tens, of resistors of the type 11 connected in parallel between P and Q. In other words, the fan out of the elementary logic circuit is very high.

Figure 5:
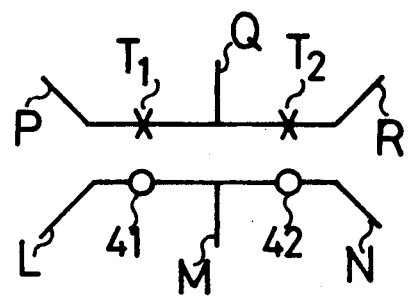
FIGS. 5, 6, 8, 9, 10 and 11 are diagrams of switching circuits.

FIG. 5 shows a switching circuit consisting of a combination of two elementary switches. The first switch, on the left, comprises a resistor 41 with terminals L and M and a thermoconductor $T_1$ with terminals P and Q. The second switch, on the right, comprises a resistor 42 with terminals M and N and a thermoconductor $T_2$ with terminals Q and R. It can be seen that the resistors and thermoconductors of the two elementary switches are respectively connected in series.

In accordance with standard logic practice, the respective possible states of the terminals L, M, N, P, Q, R are designated 1 and 0. Hereinafter the state 1 corresponds by convention to the positive potential of the d.c. voltage feed source of the logic circuit (so-called "positive" logic), whilst 0 represents the negative potential or ground.

The equation $L = \overline{M}$ means either that $L = 1$ and $M = 0$, or the reverse, as is standard practice in binary algebra.

It is obvious from FIG. 5 that
if $L = \overline{M}, Q = P$;
and if $M = \overline{N}, Q = R$.

The combination $L = \overline{M} = N$ is prohibited because it would mean $P = Q = R$ (short-circuited of the feed system). If two of these values arise out of other logic combinations, the circuit may be damaged. In order to obviate this disadvantage, it is possible to introduce protection resistors which only intervene in the event of a "fault" in the logic.

The combination $L = M = N$ is ineffective because in this case the value of Q is indeterminate, i.e. unusable. Accordingly, L and N must be opposed : $L = \overline{N}$. In other words, two control resistors can only be connected in series if the end terminals of the combination permanently receive opposite voltages.

Figure 6:
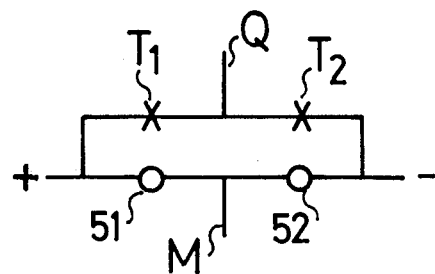

FIG. 6 shows an inverter which is one application of the preceding circuit in which it is prescribed that $P = L = 1$ and $R = N = 0$.

If $M = 0, Q = 1$ and, reciprocally, if $M = 1, Q = 0$, in other words Q is always equal to $\overline{M}$ which characterises the inversion function.

FIG. 7 diagrammatically illustrates in plan (a) and in section (b) a substrate on which the inverter shown in FIG. 6 is formed. The section has been taken along a median plane of the line X—X in (a). In the interests of clarity, no insulating layer has been shown above the thermoconductive bands $T_1$ an $T_2$ which thus appear at the surface. The substrate 60 successively supports an insulating layer 61, a continuous band of resistive material forming the two resistors 51 and 52 of the inverter circuit. At the common point of these two resistors, a metal coating is applied along a band 62, being connected to a terminal M emerging from an insulating layer 63 covering the resistors. Bands of thermoconductive material $T_1$ and $T_2$ are deposited in rectangles of which the long sides, parallel to one another, are perpendicular to the median plane of the line X—X. A band 66 of metal coating joins two short sides of these bands, forming a terminal Q of the inverter. The object of this cross arrangement of the resistor and thermoconductor coupled to it is to facilitate formation of the structure in practice without at the same time interfering with the thermal coupling. The + and − polarisation terminals are situated on metal coatings 64 and 65 connecting the free ends of the bands 51 and 52 through the insulating layer 63 to the free ends of the bands $T_1$ and $T_2$.

Figure 8:
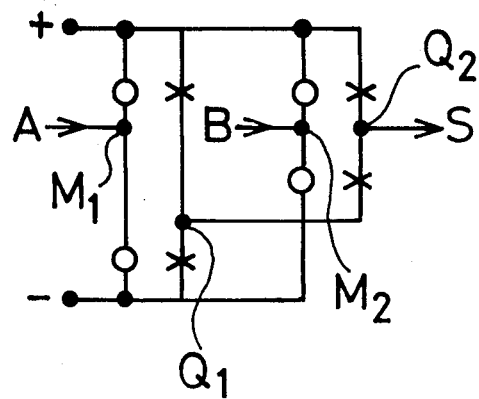

FIG. 8 diagrammatically illustrates a logic circuit formed by means of two inverters identical with the inverter illustrated in FIG. 6 and fed in parallel by a d.c. source (+ and − terminals) with a different connection for the thermoconductors (cf. FIG. 8). If A and B are the inputs located at the middle points $M_1$ and $M_2$ of the inverters and if S is the output located at the point $Q_2$ situated between the thermoconductors of the second inverter, the logic function realised is:

$$S = \overline{A.B}$$

with conventions similar to those which were defined in the description of FIG. 5 and in positive logic. In negative logic, the function would be $S = \overline{A} + \overline{B}$.

It is known that virtually any logic function can be realised from inverters. Accordingly, the invention is applicable to the formation on one and the same substrate of logic circuits which materialise different, possibly highly complex functions.

Figure 9:
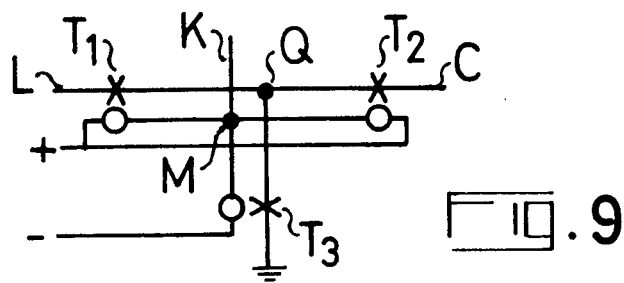

FIG. 9 diagrammatically illustrates a first example of a switching circuit known as a "single switching point" circuit which establishes a connection between a conductor L and a conductor C representing, for example, conductors connected respectively to a line (L) and to a column (C) of a switching matrix of a telephone exchange.

The switching point is in the form of a T with three thermoconductive elements $T_1$, $T_2$, $T_3$ ($T_3$ connecting the middle point Q of $T_1$ and $T_2$ to earth). The heating resistances of $T_1$ and $T_2$ are connected in parallel to the positive terminal of the d.c. feed source on the one hand and, on the other hand, to a middle point M connected to a switching control terminal K. The heating resistance of $T_3$ is connected between the negative terminal and the terminal K.

It will readily be appreciated that
if K = 0 (negative terminal), LC is "conductive";
if K = 1 (positive terminal), LC is "blocked" with the point Q at earth.

Figure 10:
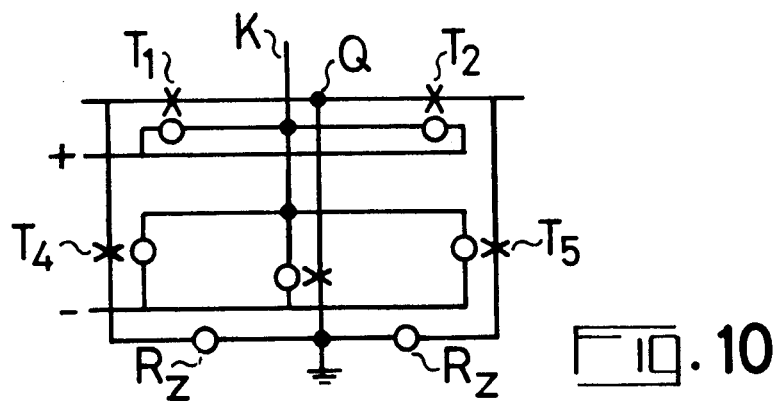

FIG. 10 shows a second example of a switching circuit known as an "adapted" switching point circuit. The conductors L and C may be connected to earth (when LC is "blocked") through a resistor $R_z$ which is equal to the mean characteristic impedance of the lines to be switched (or to half this impedance if the two line conductors are treated symmetrically in relation to earth). In addition to the three thermoconductors shown in FIG. 9, there are another two thermoconductors $T_4$ and $T_5$ which establish the connection through $R_z$ by means of resistors in parallel with the resistance of $T_3$. The control K is identical with that shown in FIG. 9. The resistors may be integrated on a common substrate of the circuit.

Figure 11:
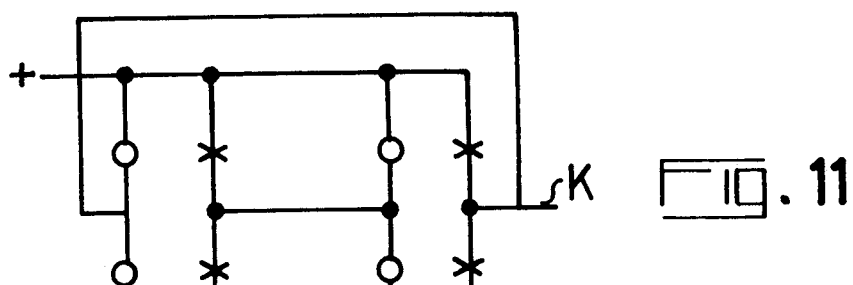

FIG. 11 shows one example of a holding circuit which is instructed from two logic inputs A and B either to hold or to change state for a switching point of which the terminal K coincides with the output of the holding circuit. This circuit comprises a cascade of two inverters connected as shown in the diagram of FIG. 11. It can readily be seen that the holding state prevails, irrespective of the previous state, if $A = B = 0$,
the "blocked" state changes to the 37 conductive" state if $A = 1$ and $B = 0$,
the "conductive" state changes to the "blocked" state if $A = B = 1$.

Figure 12:
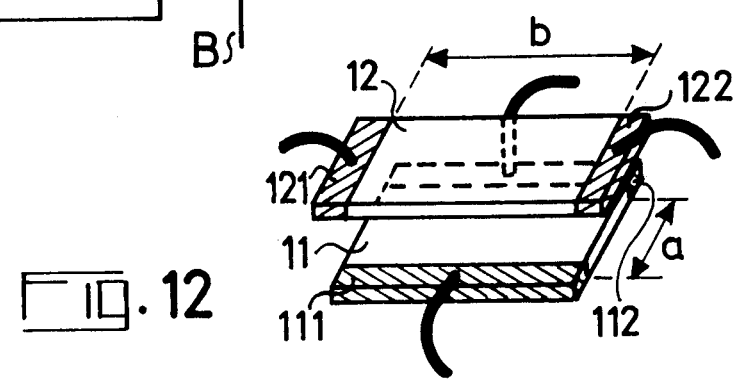
FIG. 12 shows the resistive layer and the thermoconductive layer of the circuit illustrated in FIG. 1.

The advantages of the switching points and circuits according to the invention are based on the intrinsic properties of the "thermal relay" shown in FIG. 1 essentially formed by the superposition of a resistive layer element and a thermoconductive layer element. FIG. 12 shows these two elements completed by the drawing of the terminal electrodes:

111 and 112 for the resistor 11;
121 and 122 for the thermoconductor 12.

The circuits according to the invention have the advantage of being able to switch extremely wide-band signals, for instance in multiplex communication.

The invention can also be developed in cable - distribution of television broadcasting.

Obviously, numerous modifications and variations of the present invention are possible in light of the above teachings. It is therefore to be understood that within the scope of the appended claims, the invention may be practiced otherwise than as specifically described.

What is claimed as new and desired to be secured by letters patent of the United States is:

1. An inverter logic circuit comprising:
an input terminal;
an output terminal;
a first source terminal;
a second source terminal;
means for respectively connecting the first and second source terminals to a first and a second pole of a d.c. source;
a first switching element, consisting of a first substrate, and, successively deposited on said substrate, a first layer that is electrically resistant and insulated from said substrate, said layer having one end connected to said first source terminal and an other end connected to said input terminal; a second electrically insulating and thermally conductive layer; and a third layer consisting of a thermoconductive material having one end connected to said first source terminal and another end connected to said output terminal;
a second switching element consisting of a second substrate, and, successively deposited on said substrate, a fourth layer that is electrically resistant and insulated from said substrate, said fourth layer having one end connected to said second source terminal, and another end connected to said input terminal; a fifth electrically insulating and thermally conductive layer; and a sixth layer consisting of a thermoconductive material having one end connected to said second source terminal and another end connected to said output terminal;
said input terminal adapted to be put alternately at the potential of one or the other of said poles, so as to cause the resistant layer to heat the thermoconductive layer, in order to have the potential of one or the other pole appear at said output terminal.

2. An inverter logic circuit as claimed in claim 1, wherein said thermoconductive material is $VO_2$.

3. A single switching point circuit for connecting a first conductor to a second conductor, said switching point circuit comprising:
a first conductor terminal;
a second conductor terminal;
a first source terminal;
a second source terminal;
means for respectively connecting the first and second source terminals to the opposite poles of a d.c. source;
a control terminal;

a ground terminal;

a first switching element including a substrate, a first two-terminal resistant layer and a first two-terminal thermoconductive layer thermally coupled to one another;

a second switching element including, on a substrate, a second two-terminal resistant layer and a second two-terminal thermoconductive layer thermally coupled to one another; and a third switching element including, on a substrate, a third two-terminal resistant layer and a third two-terminal thermoconductive layer thermally coupled to one another;

said first and second thermoconductive layers being connected in series between said first and second conductor terminals, with a middle point connected to said ground terminal through said thermoconductive layer and directly to said control terminal; and said first and second resistant layers being connected in parallel between said first and second source terminals through said third resistant layer.

4. A single switching point circuit as claimed in claim 3, wherein said thermoconductive layers are made of $VO_2$.

5. An adapted switching point circuit for connecting a first conductor to a second conductor of a line, said switching point circuit comprising:
   a first conductor terminal;
   a second conductor terminal;
   a first source terminal;
   a second source terminal;
   means for respectively connecting the first and second source terminals to the opposite poles of a d.c. source;
   a first resistor;
   a second resistor, the value of said first and second resistors respectively equal to the characteristic impedance of said line;
   a control terminal;
   a ground terminal;
   a first switching element including on a substrate a first two-terminal resistant layer and a first two-terminal thermoconductive layer thermally coupled to said resistant layer;
   a second switching element including on a substrate a second two-terminal resistant layer and a second two-terminal thermoconductive layer thermally coupled to said resistant layer;
   a third switching element including on a substrate a third two-terminal resistant layer and a third two-terminal thermoconductive layer thermally coupled to said resistant layer;
   a fourth switching element including on a substrate a fourth two-terminal resistant layer and a fourth two-terminal thermoconductive layer thermally coupled to said resistant layer;
   a fifth switching element including on a substrate fifth two-terminal resistant layer and a fifth two-terminal thermoconductive layer thermally coupled to said resistant layer;
   said first and second thermoconductive layers being connected in series between said first and second conductor terminals, with a middle point connected to said ground terminal through said third thermoconductive layer and directly to said control terminal;
   said first and second resistant layers being connected in parallel between said first and second terminals through said third resistant layer;
   said fourth thermoconductive layer being connected between said first conductor terminal and said ground terminal through said first resistor;
   said fifth thermoconductive layer being connected between said second conductor terminal and said ground terminal through said second resistor; and
   said fourth and fifth resistant layers being connected in parallel with said third resistant layer.

6. An adapted switching point as claimed in claim 5, wherein said thermoconductive layers are made of $VO_2$.

* * * * *